US009267980B2

(12) United States Patent
Guo et al.

(10) Patent No.: US 9,267,980 B2
(45) Date of Patent: Feb. 23, 2016

(54) CAPACITANCE EVALUATION APPARATUSES AND METHODS

(75) Inventors: Xinwei Guo, Shanghai (CN); James I. Esteves, El Dorado Hills, CA (US); Arvind Muralidharan, Folsom, CA (US); Nicholas Hendrickson, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 744 days.

(21) Appl. No.: 13/210,264

(22) Filed: Aug. 15, 2011

(65) Prior Publication Data

US 2013/0043889 A1 Feb. 21, 2013

(51) Int. Cl.
*G01R 31/12* (2006.01)
*G01R 31/08* (2006.01)
*G01R 31/02* (2006.01)
*G11C 29/02* (2006.01)
*G11C 29/50* (2006.01)

(52) U.S. Cl.
CPC ............ *G01R 31/028* (2013.01); *G01R 31/024* (2013.01); *G01R 31/025* (2013.01); *G11C 29/02* (2013.01); *G11C 29/50016* (2013.01); *G11C 29/025* (2013.01); *G11C 2029/5006* (2013.01)

(58) Field of Classification Search
CPC ............... G01R 31/028; G01R 31/024; G01R 31/3008; G01R 31/025

USPC .................................................. 324/548, 522
See application file for complete search history.

(56) References Cited

U.S. PATENT DOCUMENTS

| 5,818,268 | A | 10/1998 | Kim et al. |
|---|---|---|---|
| 6,605,985 | B2 | 8/2003 | Pagliato et al. |
| 7,414,459 | B2 | 8/2008 | Pisasale et al. |
| 7,446,549 | B2 * | 11/2008 | Tomita et al. ............... 324/750.3 |
| 8,351,166 | B2 * | 1/2013 | Chen et al. ....................... 361/15 |
| 8,669,828 | B1 * | 3/2014 | Wong et al. ..................... 333/12 |
| 2009/0237088 | A1 * | 9/2009 | Nonaka et al. ................ 324/548 |
| 2010/0308663 | A1 | 12/2010 | Agarwal et al. |
| 2011/0019321 | A1 | 1/2011 | Chen et al. |
| 2011/0026329 | A1 | 2/2011 | Wada |
| 2011/0069425 | A1 | 3/2011 | Hsu et al. |

* cited by examiner

*Primary Examiner* — Amy He
(74) *Attorney, Agent, or Firm* — Dorsey & Whitney LLP

(57) ABSTRACT

Apparatus and methods for evaluating leakage currents of capacitances are described. Capacitances having excessive leakage currents may be disabled from use. An example apparatus includes a leakage detection circuit configured to be coupled to a capacitance block. The leakage detection circuit is configured to determine whether a leakage current of a capacitance of the capacitance block exceeds a current limit and is further configured to provide an output indicative of a status of the capacitance. A detection controller is coupled to the leakage detection circuit and a register, and the detection controller is configured to store data in the register indicative of the status of the capacitance based at least in part on the signal from the leakage detection circuit.

6 Claims, 5 Drawing Sheets

CAPACITANCE EVALUATION APPARATUSES AND METHODS

TECHNICAL FIELD

Embodiments of the present invention relate generally to semiconductor integrated circuits, and more specifically, in one or more of the illustrated embodiments, to evaluating the operability of capacitances in the semiconductor integrated circuits based on leakage currents.

BACKGROUND OF THE INVENTION

Semiconductor memories are used to store information for electronic systems, such as data, commands, and other types of information. Memories may be non-volatile, which are memories capable of storing information even when power is not provided to the memory, and may be volatile, which are memories capable of storing information when power is provided to the memory. The stored information may be read from the memories by the electronic system for use at a later time. In order for the memories to be effective in this role, the memories need to operate reliably and perform as expected. That is, the memory space in which the information is stored must accurately retain the information. Additionally, memory circuitry that is used to carry out various memory operations must be reliable as well or the memory may operate incorrectly or not operate at all.

In many memories, an example of memory circuitry are voltage generators that are used to generate internal voltages for the various memory operations. A voltage pump is an example of a voltage generator that may be used to generate a pumped voltage, that is, a voltage that is greater than a supply voltage. Capacitance may be used in generating the pumped voltage. For example, the capacitances may be used as ripple capacitances by the voltage pump to smooth the pumped voltage output. In cases where the capacitance becomes inoperable, for example, the capacitance oxide breaks down and excessive leakage current result, the reliability of the entire memory may compromised and its performance degraded. Where the capacitance becomes inoperable in the field, an entire device to which includes the now unreliable memory may need to be replaced.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
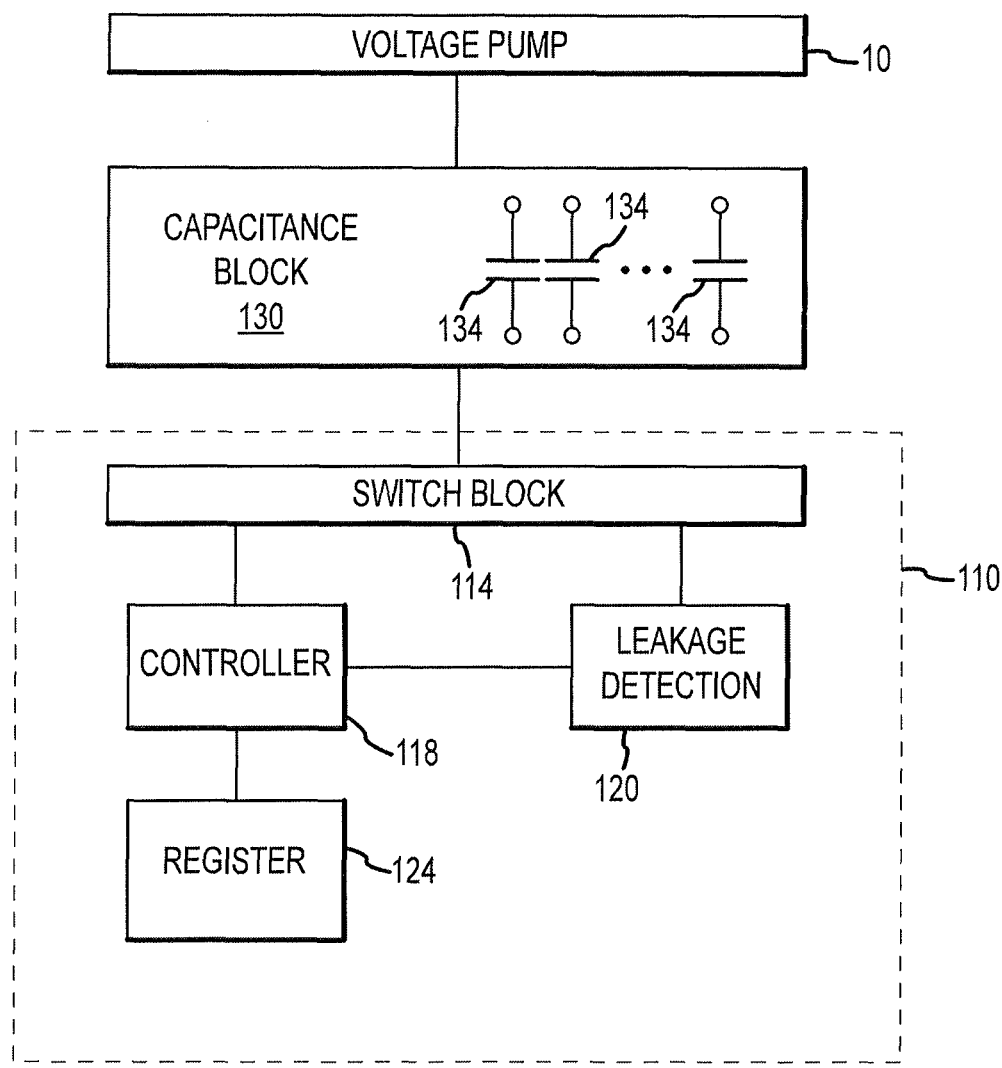
FIG. 1 is a simplified block diagram of a capacitance evaluation circuit according to an embodiment of the invention.

FIG. 1 illustrates a capacitance evaluation circuit 110 according to an embodiment of the invention. As will be described in greater detail below, the capacitance evaluation circuit 110 may be used to evaluate the operability of capacitances 134 of a capacitance block 130. The capacitances 134 may be coupled to a voltage generator 10 and used, for example, as ripple capacitances in providing a pumped voltage. The voltage generator 10 may be a voltage pump, for example. The resulting output voltage from the voltage generator 10 should be "smoother" and have less ripples in its waveform. The capacitances 134, in some embodiments, may be capacitors.

The capacitance block 130 may provide a total capacitance sufficient for use with the voltage generator 10 to generate a desired pumped voltage. That is, the capacitances 134 may each have a capacitance value and the capacitance block 130 may include a number of capacitances 134 for generating the desired pumped voltage. In some embodiments, the capacitance block 130 may include a total capacitance in excess of a minimum capacitance to generate the desired pumped voltage. For example, additional capacitances 134 in excess to the number of capacitances needed to generate the desired pumped voltage may be included in the capacitance block 130. As a result, capacitances 134 of the capacitance block 130 may be disabled from use during operation, for example, with the voltage generator 10, and the capacitance block 130 may still provide a total capacitance necessary to generate the desired pumped voltage. Particular ones of the capacitances 134 may be disabled when determined to be inoperable, for example, when the capacitance has a leakage current in excess of a current limit.

The evaluation circuit 110 includes a switch block 114 that is controlled by a controller 118. The switch block 114 includes switches that may be used to selectively enable/disable operation of capacitances 134, for example, coupling or decoupling each of the capacitances 134 for operation with the voltage generator 10. Additionally, the switch block 114 may be controlled by the controller 118 to selectively couple capacitances 134 of the capacitance block 130 to leakage detection circuit 120 for leakage current testing. The leakage detection circuit 120 is configured to determine leakage currents of capacitances 134 and provide an output indicative of the status of the capacitance (e.g., operable or inoperable). Capacitances 134 that exhibit leakage current exceeding a current limit, for example, a reference current, may be disabled from operation, such as in order to prevent excessive power consumption resulting from the leakage currents of inoperable capacitances. The switch block 114 may be used to individually couple the capacitances 134 for testing. For example, a capacitance under test may be coupled to the leakage detection circuit 120 to be tested, decoupled following testing, and a next capacitance under test coupled to the leakage detection circuit. As a result, the capacitances 134 may be tested in a serial manner, with each capacitance being evaluated before proceeding to a next capacitance, rather than testing the capacitances 134 in parallel.

The capacitances 134 that are determined to be inoperable for having excessive leakage currents may have the respective status stored by programming a register 124. For example, the controller 118 may program data in the register 124 to store the status of inoperable capacitances. Based on the data stored by the register 124, the controller 118 may control the switches of the switch block 114 to selectively disable the inoperable capacitances from operation.

Figure 2:
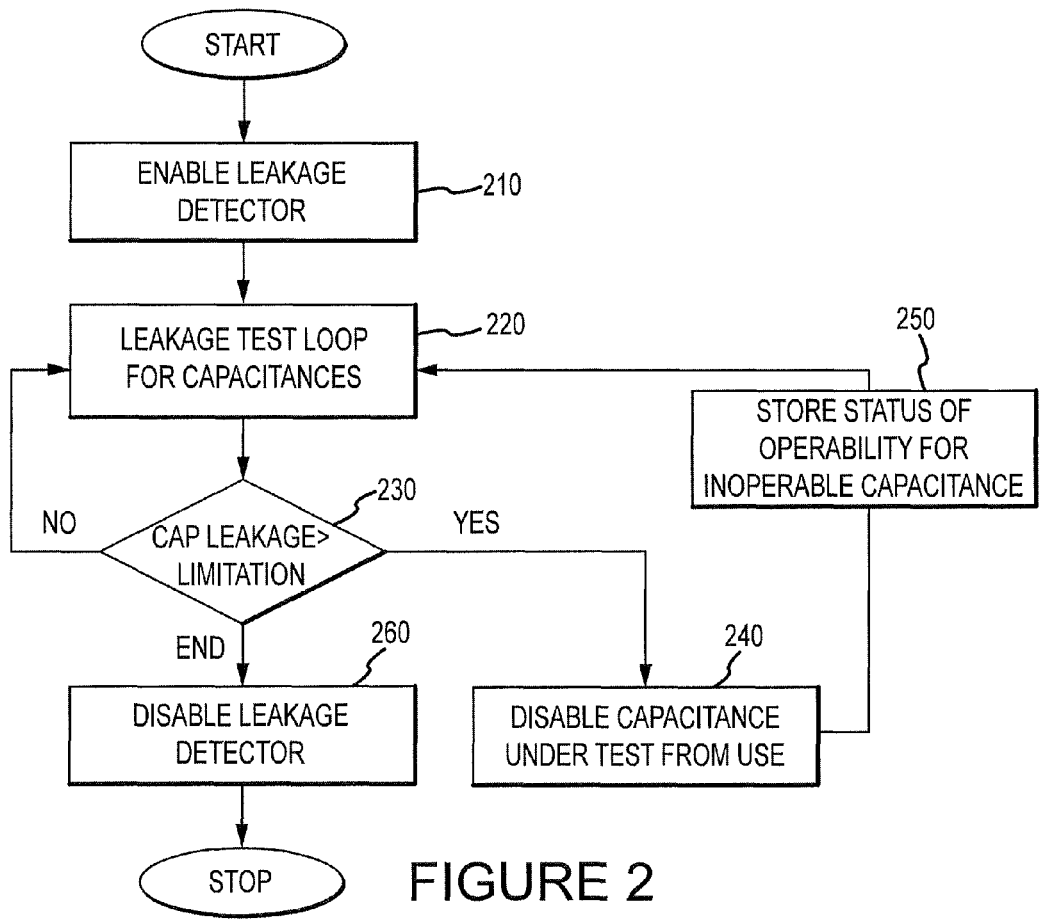
FIG. 2 is a flow diagram for operation of capacitance leakage testing according to an embodiment of the invention.

FIG. 2 illustrates a process flow for a leakage test according to an embodiment of the invention. The process flow of FIG. 2 will be described with reference to operating the capacitance evaluation circuit 110. However, the process flow of FIG. 2 may be used for operating other capacitance evaluation circuits as well. The process flow of FIG. 2 evaluates the operability of capacitances 134 of the capacitance block 130 based on leakage currents for each of the capacitances. Capacitances determined to be inoperable (e.g., exhibiting too much leakage current) may be disabled from operation, for example, from use as ripple capacitance with a voltage generator. The resulting status of inoperable capacitances may also be stored so that the inoperable capacitances may be disabled at a later time without the need to reevaluate capacitances already determined to be inoperable.

At step 210 the leakage detection circuit 120 is activated by the controller 118 to perform leakage testing of the capacitances 134 of the capacitance block 130. At step 220, the capacitances 134 are tested. The capacitances 134 may be tested by coupling a capacitance under test to the leakage detection circuit 120 through the switch block 114. The leakage test may be performed for each of the capacitances 134. In some embodiments, testing of capacitances 134 previously determined to be inoperable may be skipped.

At step 230 the capacitances 134 may be tested by determining whether the leakage current for each of the capacitances 134 exceeds a current limit. For example, the capacitances may be tested by applying a test voltage to a capacitance under test and comparing a leakage current resulting from the test voltage to a reference current. Where the leakage current does not exceed the current limit at step 230, the capacitance under test is determined to be operable and the testing is performed for another one of capacitances 134. In the event that the capacitance under test has a leakage current that exceeds the current limit at step 230, the capacitance under test is determined to be inoperable and the capacitance is disabled from use at step 240. In the embodiment of the capacitance evaluation circuit 110, an inoperable capacitance may be disabled by opening a respective switch in the switch block 114 which couples the capacitance for operation, thereby decoupling the capacitance from operation. At step 250 the status for the inoperable capacitance may be stored, for example, in a non-volatile memory. In some embodiments, the status for inoperable capacitances are stored before the inoperable capacitance is disabled. The stored status may then be used by the controller 118 to disable the inoperable capacitance from use. The leakage testing is repeated for the capacitances 134 until no further capacitances 134 are to be tested. When no other capacitances are to be tested, the leakage detection circuit 120 is then disabled at step 260 and the leakage testing is complete.

The leakage testing may be performed responsive to a command, or may be performed periodically. In some embodiments, the leakage testing is performed responsive to an event, such as part of a power up sequence. In some embodiments, the leakage testing may be performed as part of an operation. For example, where the capacitance evaluation circuit 110 is included in a non-volatile memory, and the capacitances 134 of the capacitance block 130 are used as ripple capacitances for a voltage generator, such as an erase voltage generator, the leakage testing may be performed when an erase operation is to be performed and an erase voltage is to be generated by the voltage generator. In this manner, any inoperable capacitance having excessive leakage currents may be disabled from operation before generation of the erase voltage. In other examples, the capacitances 134 are used when generating a read voltage or a program voltage, and the leakage test may be performed responsive to a read operation or a program operation.

Figure 3:
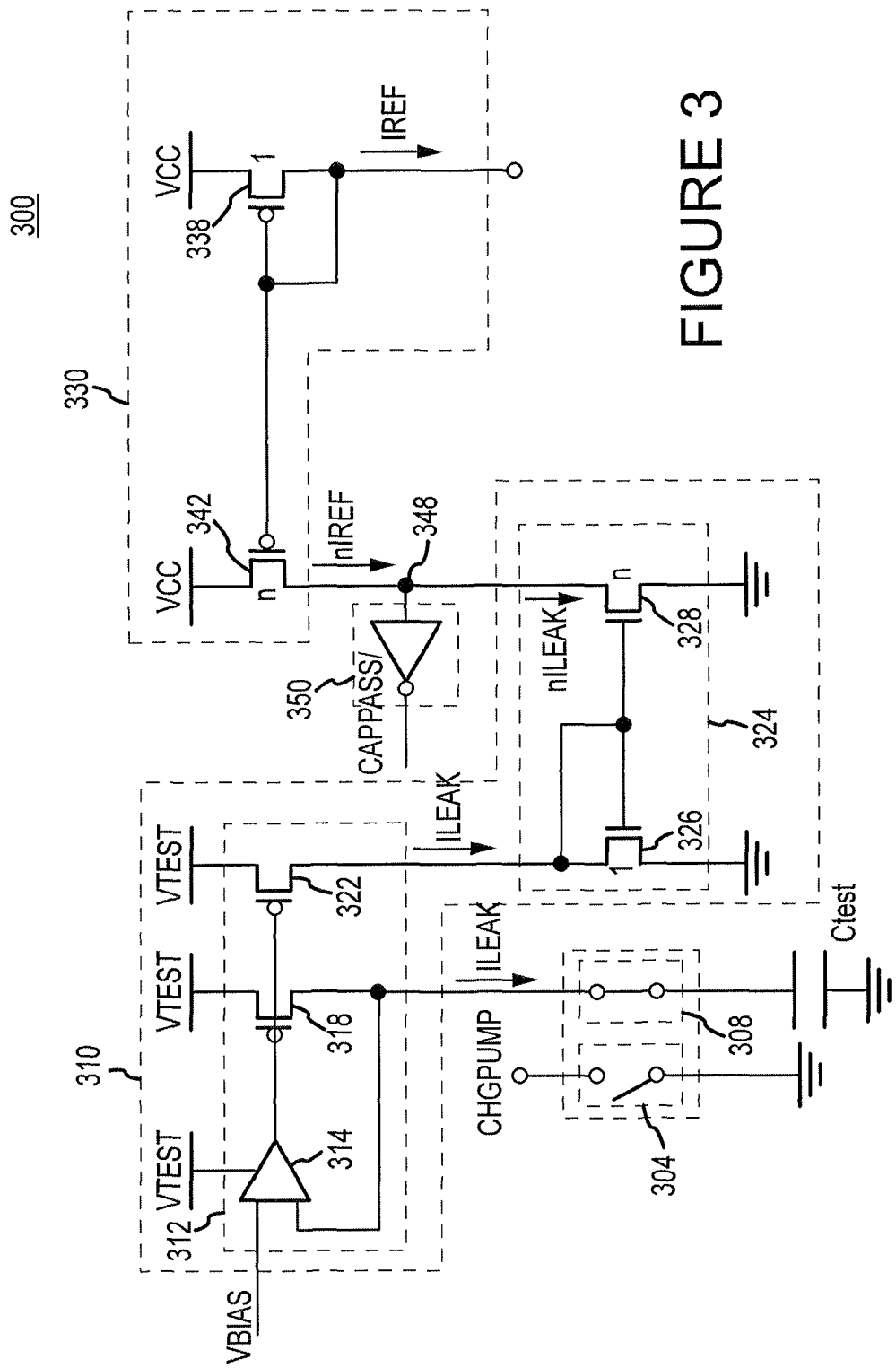
FIG. 3 is a schematic diagram of a leakage detection circuit according to an embodiment of the invention.

FIG. 3 illustrates a leakage detection circuit 300 according to an embodiment of the invention. The leakage detection circuit 300 may be used for the leakage detection circuit 120 of FIG. 1. As will be described in more detail below, the leakage detection circuit 300 provides a voltage (i.e., the VBIAS voltage) to a capacitance under test Ctest and compares a resulting leakage current ILEAK to a reference current IREF. Based on the comparison, the leakage detection circuit 300 provides an output CAPPASS/ having a logic level indicative of whether the ILEAK current does not exceed the IREF current (i.e., the Ctest capacitance passes the leakage test) or whether the ILEAK current exceeds the IREF current (i.e., the Ctest capacitance fails the leakage test). In some embodiments, capacitance evaluation circuits including the leakage detection circuit 300 may be used to evaluate the operability of capacitances prior to use or as part of the operation of generating a pumped voltage with a voltage generator.

The leakage detection circuit 300 includes a measurement circuit 310 and a reference circuit 330. The measurement circuit 310 is configured to provide a leakage current ILEAK for a capacitance under test Ctest responsive to a test voltage VBIAS provided to the Ctest capacitance. A capacitance may be selectively coupled and decoupled for operation (e.g., coupled or decoupled to a voltage generator) through switch 304 and the capacitance may be selected for testing through a respective switch 308. When a particular capacitance is to be tested, the switch 304 is open and the switch 308 is closed (as shown in FIG. 3). The switches 304 and 308 may be included in a switch block, for example, switch block 114 of FIG. 1. The reference circuit 330 is configured to provide a reference current IREF against which the ILEAK current is compared.

An output circuit 350 is coupled to a node 348 and provides an output signal CAPPASS/ having a logic level indicative of whether the ILEAK current of the Ctest capacitance does not exceed (or exceeds) the IREF current, and consequently, passes (or fails) the leakage test and is considered an operable (or inoperable) capacitance. As shown in FIG. 3, the CAPPASS/ signal is an active low logic signal, however, an active high logic signal may be used in other embodiments. Where the ILEAK current exceeds the IREF current, however, the Ctest capacitance is considered to be inoperable. As previously described with reference to FIGS. 1 and 2, inoperable capacitances may be disabled so that they are not used by a voltage generator in providing an output voltage, for example, a pumped voltage. The output circuit 350 is illustrated in the embodiment of FIG. 3 as an inverter, however, other types of output circuits may be used as well which are configured to provide an output signal that is indicative of the status of the Ctest capacitance.

The measurement circuit 310 includes measurement circuit 312 and a current mirror 324. The measurement circuit 312 includes an amplifier 314 coupled in a negative feedback configuration that is configured to receive a bias voltage VBIAS and provide an output voltage to transistors 318 and 322. The transistors 318 and 322 have similar transistor characteristics and are similarly responsive to the output voltage provided the amplifier 314. The amplifier 314 and transistors 318 and 322 are coupled to a voltage supply configured to provide the VTEST voltage.

The VBIAS voltage is typically less than the VTEST voltage, for example, in some embodiments the VBIAS voltage is approximately one-half of the VTEST voltage. With the VBIAS voltage less than the VTEST voltage (e.g., by more than a threshold voltage of the transistor 318) the transistor 318 is conductive. A VBIAS voltage is provided to a capacitance under test (not shown) resulting from a negative feedback configuration of the amplifier 314. A resulting ILEAK current is established through the transistor 318 which is similarly established through the transistor 322 because of the common output voltage from the amplifier 314. The ILEAK current through the transistor 322 is provided to the current mirror 324. The current mirror 324 includes a transistor 326 that is coupled to a transistor 328 in a current mirror configuration, which results in the ILEAK current mirrored as an nILEAK current through transistor 328. The transistor 328 may be scaled (e.g., by the factor of n) relative to the transistor 326 to scale the nILEAK current relative to the ILEAK current.

The reference circuit 330 includes transistors 338 and 342 coupled in a current mirror configuration. A IREF current provided to the transistor 338, for example, provided by a current source (not shown), is mirrored by transistor 342 as an nIREF current. The transistor 342 may be scaled (e.g., by a factor of n) relative to the transistor 338 to scale the nIREF current relative to the IREF current. As previously discussed, the nILEAK current may be scaled by the transistor 328. Scaling of the nIREF and nILEAK currents may be desirable to improve sensitivity in determining whether the ILEAK current is less than or greater than the IREF current.

Based at least in part on the nIREF and nILEAK currents, the output circuit 350 provides the CAPPASS/ signal, which as previously discussed, has a logic level indicative of whether the ILEAK current of the Ctest capacitance exceeds the IREF current.

In the embodiment FIG. 3, the transistors 318 and 322 of the measurement circuit 310 are p-channel field effect transistors (pFETs) and the transistor 326 is a n-channel field effect transistor (nFET). The transistors 338 and 342 are pFETs and the transistor 328 is an nFET. In other embodiments of the invention, a leakage detection circuit may include different types of transistors than that shown for the embodiment of FIG. 3.

In operation, the capacitance under test Ctest is decoupled from operation by opening switch 304 and coupled for testing by closing switch 308. The VBIAS voltage is provided to the Ctest capacitance through the transistor 318 (and the closed switch 308), which is activated by the output voltage of the amplifier 314 to set the conductivity of the transistor 318. With the VBIAS voltage provided to the capacitance, a resulting ILEAK current is established through the transistor 318. The amplifier 314 further provides the output voltage to activate the transistor 322 and set its conductivity to substantially the same as for the transistor 318. As a result, the ILEAK current is substantially replicated through transistor 322 and provided to the transistor 326.

The ILEAK current is mirrored (and possibly scaled) through the transistor 328 as the nILEAK current, which is provided to the output circuit 350 at node 348. The IREF current to which the ILEAK current is compared is provided to the transistor 338. The IREF current is mirrored (and possible scaled) through the transistor 342 and provided as the nIREF current to the output circuit 350 at node 348.

The output circuit 350 provides an output CAPPASS/ based at least on the nILEAK and nIREF currents provided to the node 348. Where the nILEAK current does not exceed the nIREF current, the resulting voltage at the node 348 is relatively high voltage which causes the output circuit 350 to provide a low logic level CAPPASS/ signal indicating that the Ctest capacitance passes the leakage test. In contrast, where the nILEAK current exceeds the nIREF current, the resulting voltage at the node 348 is a relatively low voltage which causes the output circuit 350 to provide a high logic level CAPPASS/ signal indicating that the Ctest capacitance fails the leakage test.

Figure 4:
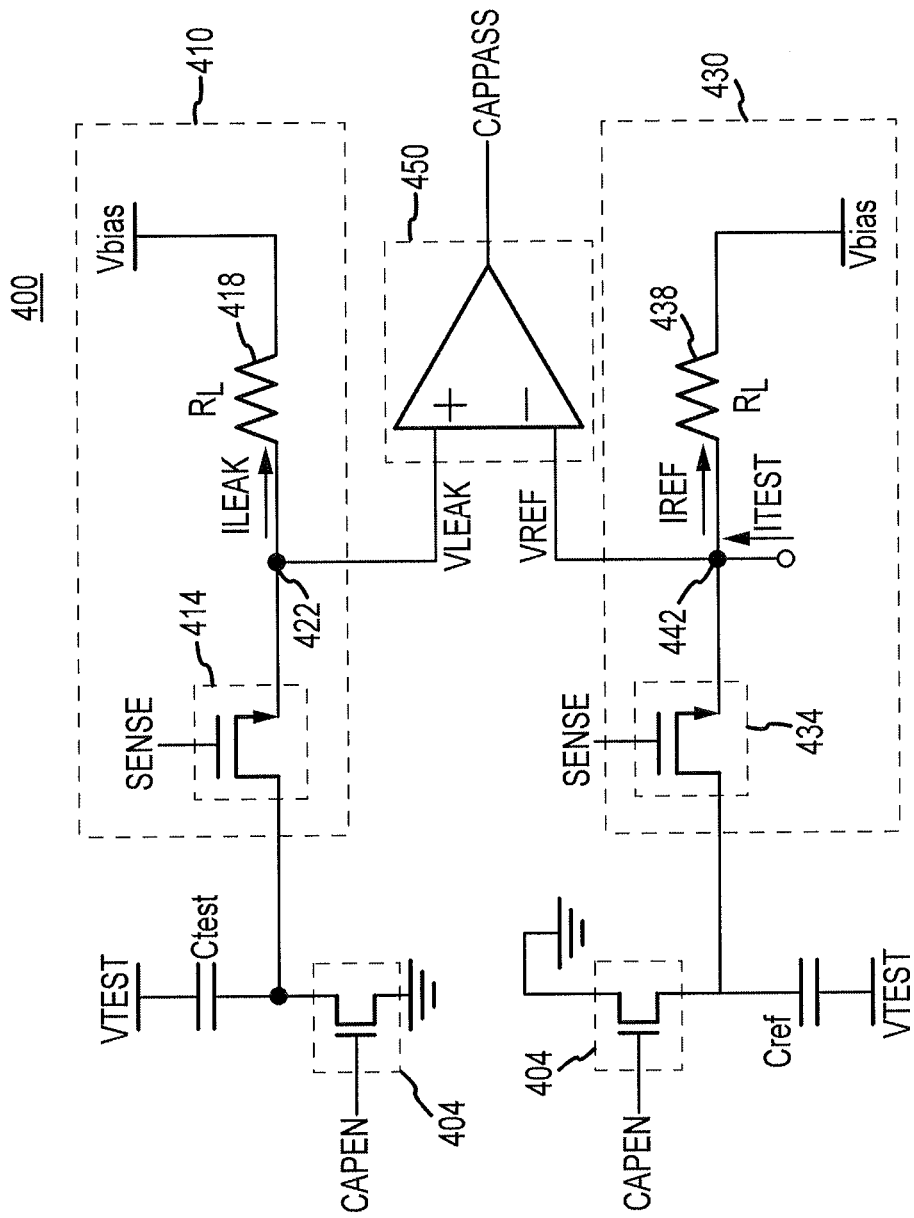
FIG. 4 is a schematic diagram of a leakage detection circuit according to an embodiment of the invention.

FIG. 4 illustrates a leakage detection circuit 400 according to an embodiment of the invention. The leakage detection circuit 400 may be used for the leakage detection circuit 120 of FIG. 1. In some embodiments, capacitance evaluation circuits including the leakage detection circuit 400 may be used to evaluate the operability of capacitances even as capacitances of a capacitance block are being used in generating a pumped voltage with a voltage generator. For example, as previously discussed, a capacitance block may include a total capacitance in excess of the capacitance needed to generate a desired pumped voltage (e.g., by including "extra" capacitances). Because all of the capacitances may not be needed to provided the desired pumped voltage, the extra capacitances may be evaluated for operability even if the other capacitances of the capacitance block are in use.

The leakage detection circuit 400 includes a measurement circuit 410 and a reference circuit 430. The measurement circuit 410 is configured to provide a voltage VLEAK that results from a leakage current ILEAK for a capacitance under test. The ILEAK current results from application of a test voltage VTEST to a capacitance under test Ctest. The reference circuit 430 is configured to provide a voltage VREF that results from a reference current IREF. The IREF current is based at least in part on providing the VTEST voltage to a reference capacitance Cref. The Ctest and Cref capacitances may be selectively disabled by deactivating respective switches 404. The switches 404 enable and disable the capacitance by coupling and decoupling a capacitor plate of the capacitance responsive to a respective control signal CAPEN. The switches 404 may be included in a switch block, for example, switch block 114 of FIG. 1. In the embodiment of FIG. 4, the switches 404 are implemented as nFET transistors which are activated by an active (high) CAPEN signal. Other circuits and configurations may be used for the switches 404 and control signals, however.

An output circuit 450 is coupled to the measurement circuit 410 and the reference circuit 430 to compare the VLEAK and VREF voltages. Based at least in part on the comparison, the output circuit 450 provides an output signal CAPPASS having a logic level indicative of whether the ILEAK current of the capacitance under test does not exceed the IREF current (e.g., the VLEAK voltage is less than the VREF voltage), and consequently, passes the leakage test and is considered an operable capacitance. Where the ILEAK current exceeds the IREF current (e.g., the VLEAK voltage is greater than the VREF voltage), however, the capacitance under test fails the test and is considered to be inoperable. As previously described with reference to FIG. 1, inoperable capacitances may be disabled so that they are not used by a voltage generator in providing an output voltage, for example, a pumped voltage. The output circuit 450 is illustrated in the embodiment of FIG. 4 as an amplifier configured as a comparator, however, other types of output circuits may be used as well which are configured to provide an output signal that is indicative of the status of a capacitance under test.

The measurement circuit 410 includes a switch 414 that is controlled by a control signal SENSE to couple the Ctest capacitance to a resistance 418 at the node 422. The SENSE signal may be provided by a controller, for example, controller 118 of FIG. 1, to enable testing of the Ctest capacitance. The resistance 418 is further coupled to a voltage supply that provides a bias voltage VBIAS. The reference circuit 430 includes a switch 434 that is controlled by the SENSE signal to couple the Cref capacitance to a resistance 438 at the node 442. The resistance 438 is further coupled to the voltage supply that provides the VBIAS voltage. Provided to the node 442 is a test current ITEST that is used to establish the IREF current. The IREF current is used for providing the VREF voltage to which the VLEAK voltage from the measurement circuit 410 is compared by the output circuit 450.

The switches 414 and 434, and the resistances 418 and 438 are generally matched, that is, the switches and the resistances have substantially similar electrical characteristics. For example, the switches 414 and 434 may have substantially the same switching response times and current capacity (e.g., within plus or minus 10 percent for both time and current), and the resistances 418 and 438 may have respective resistances within, for example, 10 percent of each other. In some embodiments, the switches 414 and 434 may have the same transistor dimensions (L/W) and the resistances 418 and 438 may have the same circuit dimensions as well. The switches 414 and 434 are illustrated as nFETs for the embodiment of FIG. 4, however, other types of circuits may be used as well. The resistances 418 and 438 of the embodiment of FIG. 4 are resistors, but other types of resistances may be used as well in other embodiments.

The Cref capacitance may be capacitance included in the same capacitance block as the Ctest capacitance. In some embodiments, the Cref capacitance is any of the operable capacitances in the capacitance block, other than the Ctest capacitance being evaluated. The Cref capacitance may also be a capacitance provided for the specific purpose of providing a reference capacitance, which may be included in the same capacitance block as the Ctest capacitance, or located elsewhere.

In operation, a capacitance under test Ctest and a reference capacitance Cref are disabled from use by opening the respective switches 404. The leakage detection circuit 400 compares a VLEAK voltage from the measurement circuit 410 to a VREF voltage from the reference circuit 430. The VLEAK voltage is based at least in part on an ILEAK current that results from the Ctest capacitance to which the VTEST voltage is provided. The VREF voltage is based at least in part on an IREF current that results from a Cref capacitance to which the VTEST voltage is provided and the ITEST current provided to the reference circuit 430. Based on the comparison, the leakage detection circuit 400 provides an output CAPPASS having a logic level indicative of whether the ILEAK current does not exceed the IREF current (i.e., the capacitance under test passes the leakage test) or whether the ILEAK current exceeds the IREF current (i.e., the capacitance under test fails the leakage test).

When testing the Ctest capacitance, a VTEST voltage is provided to the Ctest capacitance. The Ctest capacitance is coupled to the node 422 of the measurement circuit 410 through the switch 414, which is activated by an active SENSE signal. The VTEST voltage is also provided to the Cref capacitance which is coupled to the node 442 of the reference circuit 430 through the switch 434, also activated by the active SENSE signal. With the Ctest capacitance coupled to the node 422, a resulting ILEAK current is used to provide a VLEAK voltage at node 422. A VREF voltage at node 442 results from an IREF current established by the Cref capacitance coupled to the node 442 and the ITEST current.

Where the ILEAK current is less than the IREF current, the VLEAK voltage is less than the VREF voltage, and as a result, the output circuit 450 provides a CAPPASS signal having a low logic level to indicate that the Ctest capacitance passes the test. In contrast, when the ILEAK current is greater than the IREF current, the VLEAK voltage is greater than the VREF voltage and the output circuit 450 provides a CAPPASS signal having a high logic level to indicate that the Ctest capacitance fails the test.

In some embodiments, the leakage detection circuit 400 may be used to provide coarse and fine leakage detection. For example, during a power-up sequence, coarse leakage detection may be performed to identify inoperable capacitances and disable them from use. Coarse leakage detection may take relatively less time than fine leakage detection. As a result, coarse evaluation of the capacitances may be made during power-up to disable inoperable capacitances without taking as long as if fine leakage detection were performed. Fine leakage detection may be performed at times other than during power-up. Fine leakage detection allows for detection of smaller differences between ILEAK and IREF in comparison to coarse leakage detection.

Coarse and fine leakage detection may be implemented by changing the precision of the output circuit 450. That is, the sensitivity of the output circuit 450 to differences between VLEAK and VREF voltage may be increased for fine leakage detection. Greater precision of the output circuit 450, with reference to the embodiment of FIG. 4 having a comparator output circuit, may be provided by increasing the resistances 418, 438. During power-up and coarse leakage detection, for example, a first resistance may be provided by resistances 418, 438, and during fine leakage detection a second resistance (greater than the first resistance) may be provided by resistances 418, 438 to increase precision of the output circuit 450. Those ordinarily skilled in the art have sufficient understanding from the description provided herein to provide such first and second resistances using conventional circuits. Consequently, a detailed description for such resistances is not provided herein.

Figure 5:
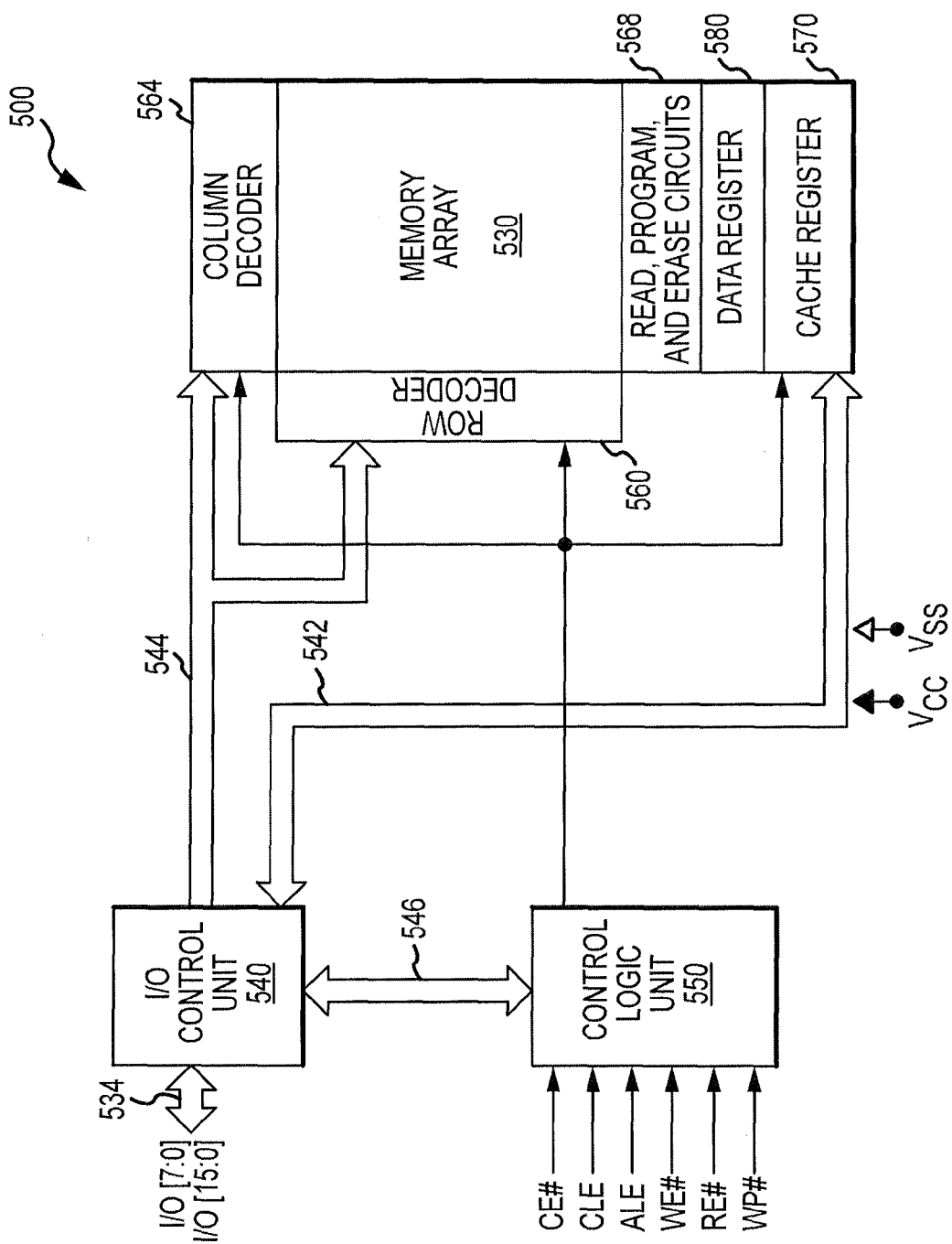
FIG. 5 is a block diagram of a memory including a capacitance evaluation circuit according to an embodiment of the invention.

FIG. 5 illustrates a memory 500 including a capacitance evaluation circuit according to an embodiment of the present invention. The memory 500 includes an array 530 of memory cells. Command signals, address signals and write data signals may be provided to the memory 500 as sets of sequential input/output ("I/O") signals transmitted through an I/O bus 534. Similarly, read data signals may be provided from the flash memory 600 through the I/O bus 534. The I/O bus is connected to an I/O control unit 540 that routes the signals between the I/O bus 534 and an internal data bus 542, an internal address bus 544, and an internal command bus 546. The memory 500 also includes a control logic unit 550 that receives a number of control signals either externally or through the command bus 546 to control the operation of the memory 500.

The address bus 544 applies block-row address signals to a row decoder 560 and column address signals to a column decoder 564. The row decoder 560 and column decoder 564 may be used to select blocks of memory or memory cells for memory operations, for example, read, program, and erase operations. The column decoder 564 enables write data signals to be applied to columns of memory corresponding to the column address signals and allow read data signals to be coupled from columns corresponding to the column address signals.

In response to the memory commands decoded by the control logic unit 550, the memory cells in the array 530 are read, programmed, or erased. Read, program, and erase circuits 568 coupled to the memory array 530 receive control signals from the control logic unit 550 and include voltage generators for generating various pumped voltages for read, program and erase operations. The read, program, and erase circuits further include capacitance evaluation circuits according to embodiments of the invention. The capacitance evaluation circuits are configured to evaluate capacitances of a capacitance block to determine operability of the capacitances. In the event particular ones of the capacitances are evaluated as inoperable, the capacitance may be disabled from use with a voltage generator.

After the row address signals have been applied to the address bus 544, the I/O control unit 540 routes write data signals to a cache register 570. The write data signals are stored in the cache register 570 in successive sets each having a size corresponding to the width of the I/O bus 534. The cache register 570 sequentially stores the sets of write data signals for an entire row or page of memory cells in the array 530. All of the stored write data signals are then used to program a row or page of memory cells in the array 530 selected by the block-row address coupled through the address bus 544. In a similar manner, during a read operation, data signals from a row or block of memory cells selected by the block-row address coupled through the address bus 544 are stored in a data register 580. Sets of data signals corresponding in size to the width of the I/O bus 534 are then sequentially transferred through the I/O control unit 540 from the data register 580 to the I/O bus 534.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a leakage detection circuit configured to be coupled to a capacitance block, the leakage detection circuit configured to determine whether a leakage current of a capacitance of the capacitance block exceeds a reference current and further configured to provide an output indicative of a status of the capacitance, the leakage detection circuit including an output circuit having an input node and an output node, the output circuit configured to receive both the leakage and reference currents at the same input node, and based at least in part on the leakage and reference currents provide the output from the output node having a logic level indicative of whether the leakage current exceeds the reference current;
a register; and
a controller coupled to the leakage detection circuit and the register, the controller configured to store data in the register indicative of the status of the capacitance based at least in part on the output from the leakage detection circuit.

2. The apparatus of claim 1 wherein the leakage detection circuit comprises:
a measurement circuit configured to be coupled to the capacitance and further configured to apply a test voltage to the capacitance and provide the leakage current; and
a reference circuit configured to provide a reference current.

3. The apparatus of claim 2 wherein the reference circuit comprises a current mirror configured to receive the reference current and mirror the same to the output circuit.

4. The apparatus of claim 2 wherein the measurement circuit comprises:
measurement circuit configured to provide the test voltage to the capacitance and to provide a resultant leakage current; and
a current mirror coupled to the measurement circuit and configured to mirror the resultant leakage current as the leakage current.

5. The apparatus of claim 4 wherein the measurement circuit comprises
a negative feedback configured amplifier configured to be coupled to a test voltage supply and further configured to provide an output voltage responsive to a bias voltage provided to a negative input and a voltage provided to a positive input;
a first transistor coupled to the negative feedback configured amplifier and configured to be coupled to the test voltage supply, the first transistor configured to couple the capacitance and the positive voltage input to the bias voltage supply responsive to the output voltage of the negative feedback configured amplifier; and
a second transistor coupled to the negative feedback configured amplifier and configured to be coupled to the test voltage supply, the second transistor having substantially similar transistor characteristics as the first transistor and configured to provide the resultant leakage current to the current mirror responsive to the output voltage of the negative feedback configured amplifier.

6. The apparatus of claim 2 wherein the output circuit comprises an inverter.

* * * * *